United States Patent [19]

Kosugi et al.

[11] 4,321,585
[45] Mar. 23, 1982

[54] INTERPOLATIVE DIGITAL-TO-ANALOG CONVERTER FOR LINEAR PCM CODE

[75] Inventors: Hiroshi Kosugi, Yokohama; Kunio Imai, Kodaira, both of Japan

[73] Assignee: Hitachi, Ltd., Tokyo, Japan

[21] Appl. No.: 69,063

[22] Filed: Aug. 23, 1979

[30] Foreign Application Priority Data

Aug. 23, 1979 [JP] Japan ............................ 53/114652[U]

[51] Int. Cl.³ .................................................. H03K 13/02
[52] U.S. Cl. ............................ 340/347 DA; 340/347 M
[58] Field of Search .................. 340/347 M, 347 DA; 370/7, 109

[56] References Cited

U.S. PATENT DOCUMENTS 3,987,436 10/1976 Candy et al. .................. 340/347 M
4,231,022 10/1980 Kosugi et al. .................. 370/109 X

OTHER PUBLICATIONS

Ritchie et al, Interpolative Digital-to-Analog Converters, IEEE Transactions on Communications, vol. COM-22, No. 11, 11/1974, pp. 1797–1806.

Henry et al, An Integrated PCM Encoder Using Interpolation, 1978 IEEE International Solid-State Circuits Conference, pp. 184, 185.

Primary Examiner—Thomas J. Sloyan
Attorney, Agent, or Firm—Craig and Antonelli

[57] ABSTRACT

A digital-to-analog converter which is effective for an interpolative decoder for decoding a linear PCM signal is disclosed. An output signal of a binary rate multiplier which develops signals of several less-significant bits of the linear PCM signal onto a time axis is directly applied to a driver circuit, by which is driven the segment of a ladder resistance network corresponding to the least significant bit, the ladder resistance network having segments corresponding to signals of several more-significant bits of the linear PCM signal. Thus, an adder for the digital addition between the output signal of the binary rate multiplier and the signals of the several more-significant bits is dispensed with.

5 Claims, 3 Drawing Figures

INTERPOLATIVE DIGITAL-TO-ANALOG CONVERTER FOR LINEAR PCM CODE

BACKGROUND OF THE INVENTION

This invention relates to digital-to-analog converters, and more particularly to a digital-to-analog converter of the type known as an interpolative decoder for decoding a linear PCM code.

An interpolative decoder is described in detail in G. R. Ritchie et al; "Interpolative Digital to Analog Converters", IEEE, COM-22, 11, November, 1974. The feature of this system consists in that the conversion of a quantized level into an analog value is not entirely realized with a ladder circuit. Instead, only a segment end is realized with a ladder circuit, and levels equally divided within a segment (hereinbelow, termed "uniformly quantized levels") are realized by time averaging operations. This brings forth the effect that the resistance precision required for the ladder resistance network is moderated considerably.

The prior-art interpolative decoder, however, has had the disadvantage that the circuit arrangement becomes complicated because the signals relating to the more significant bits and the 1-bit signals into which the signals relating to the less significant bits representative of the uniformly quantized level which are developed on a time axis are added in a digital stage. Supposing, by way of example, that it is desired to produce an interpolative decoder for receiving a signal of 12 bits in which 7 bits among the more significant 8 bits, except for 1 polarity bit, are allotted to segment select bit signals, and in which 4 bits constitute uniformly quantized bit signals to be developed on a time axis, in such case, a digital adder of 8 bits and a register for storing an added result are required. Therefore, in a case where this interpolative decoder is put into an IC, the area of the device becomes large.

SUMMARY OF THE INVENTION

The first object of this invention is to provide an interpolative decoder of simple circuit arrangement.

The second object of this invention is to provide an interpolative decoder suited to the form of an IC.

In order to accomplish these objects, this invention provides a digital-to-analog converter comprising means for temporarily storing a digital input signal having a plurality of bits, binary rate multiplier means for developing signals corresponding to several of the less-significant bits of the digital input signal into a train of 1-bit signals on a time axis, a ladder resistance network which has segments for receiving signals corresponding to several of the more-significant bits of the digital input signal, a group of driver circuits which drives the ladder resistance network with the signals of the more significant bits, and a driver circuit which drives the segment corresponding to the least significant bit of the ladder resistance network with the output signal of the binary rate multiplier means.

DESCRIPTION OF THE PRIOR ART

Figure 1:
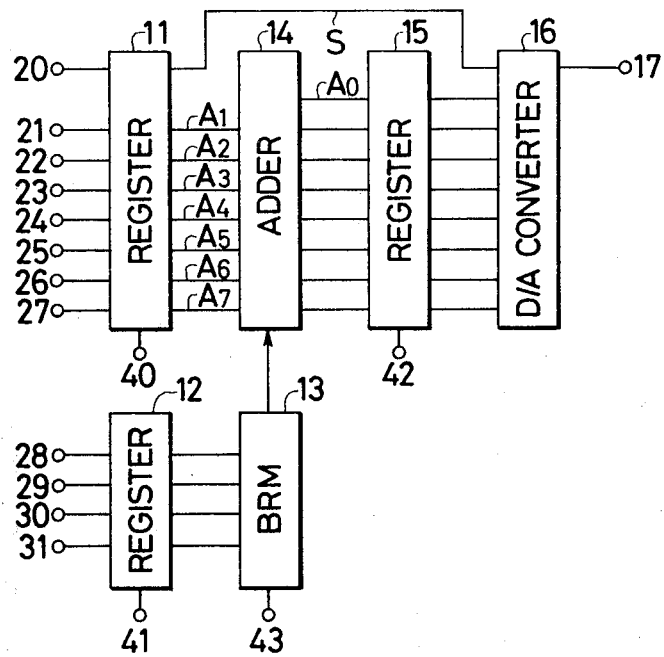
FIG. 1 is a circuit arrangement diagram of a prior-art interpolative decoder.

Before describing this invention in detail, a prior-art interpolative decoder will be explained with reference to FIG. 1. In this example a linear PCM code of 12 bits is converted into an analog signal.

In the figure, a polarity bit signal of a PCM quantized signal of 12 bits and segment select bit signals of 7 bits representative of segment number are stored in a register 11 through an input terminal 20 and through input terminals 21–27 during each sampling period, respectively. On the other hand, a signal of 4 bits representative of a quantized level within the segment is stored in a register 12 through input terminals 28–31.

The content of the register 12 is supplied to a binary rate multiplier (BRM) 13, from which a group of 1-bit signals corresponding to the content is delivered. The BRM 13 is means according to which binary codes to be developed on a time axis are made "1" in a number corresponding to the magnitude of the supplied digital signal, the others of the binary codes being made "0". That is, the quantized bit signal is developed into a 1-bit signal of "1" or "0" every sub-interval within one sampling period by means of the BRM 13. The 1-bit signals developed on the time axis are added to the least bit signal of the segment select bit signal in a digital adder 14. The output from the digital adder 14 is temporarily stored in a register 15. The content of the register 15 is supplied to a D/A converter 16 and converted into an analog signal, which is delivered to an output terminal 17. The D/A converter is made up of a ladder resistance network and a group of driver circuits for driving the resistance network. Numerals 40 and 41 designate input terminals for the receipt of clock signals to be applied to the registers 11 and 12, respectively, and numerals 42 and 43 designate input terminals for the receipt of clock signals to be applied to the register 15 and the BRM 13, respectively. The frequency of the clock signals to be applied to the register 15 and the BRM 13 is 16 times higher than that of the clock signals to be applied to the registers 11 and 12.

DESCRIPTION OF THE PREFERRED EMBODIMENT

Figure 2:
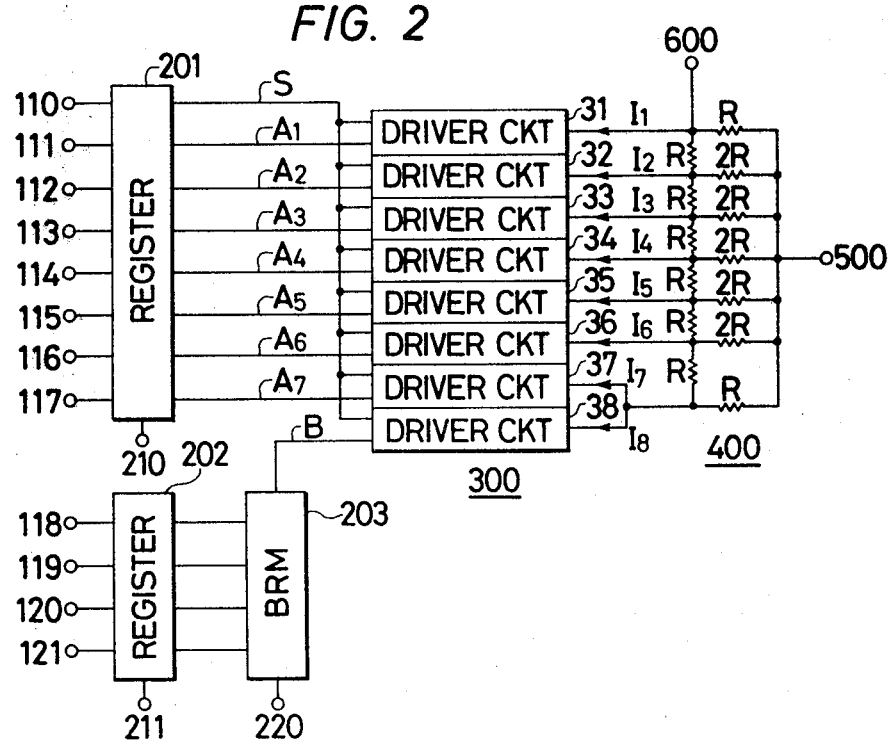
FIG. 2 is a circuit arrangement diagram showing an embodiment of an interpolative decoder according to this invention.

FIG. 2 shows an embodiment of this invention. In order to more clearly indicate the improvement which the present invention affords over the prior art, the embodiment will be explained with reference to the same example of converting a linear PCM code of 12 bits into an analog signal as used to describe the prior art, but it should be understood that the invention is in no way restricted thereto.

Referring to the figure, numerals 201 and 202 designate storing registers, respectively. Numerals 110–121 designate input terminals of the linear PCM code of 12 bits at a sampling frequency of 32 KHz. The input terminal 110 receives a polarity bit signal S which is the most significant bit signal of the linear PCM signal, the input terminals 111–117 receive segment select bit signals $A_i$, and the input terminals 118–121 receive uniformly quantized bit signals. Therefore, the input terminal 121 is a terminal which receives the least significant bit signal. In general, the linear PCM signals are supplied to the storing registers 201 and 202 from a buffer register for deserialization (not shown).

Numeral 203 indicates means according to which the uniformly quantized bit signals of 4 bits carried by the register 202 are developed into a group of 1-bit signals B at 512 KHz (16 times the sampling frequency) on a time axis. This means 203 is, for example, a binary rate multiplier (BRM). Numeral 300 indicates a group of driver circuits which drive a ladder resistance network 400 consisting of a plurality of segments. Shown at 31–37 are driver circuits which correspond to the segment select bit signals applied to the input terminals 111–117, respectively. The ladder resistance network 400 illustrated in the figure is of the well-known R-2R type. Shown at 38 is a driver circuit which drives the segment of the ladder resistance network 400 corresponding to the least significant bit by the use of an output from the BRM 203. Numeral 500 indicates a power supply terminal of the ladder resistance network, and numeral 600 an output terminal thereof. Numerals 210 and 211 indicate input terminals of pulse signals (clock) for storing the linear PCM code into the registers 201 and 202 every period $T_1$ (31.25 μs), respectively. Numeral 220 indicates an input terminal of a pulse signal (clock) at a period $T_2$ (1.95 μs, $T_2 = T_1/16$) for developing the content of the register 202 on the time axis.

Figure 3:
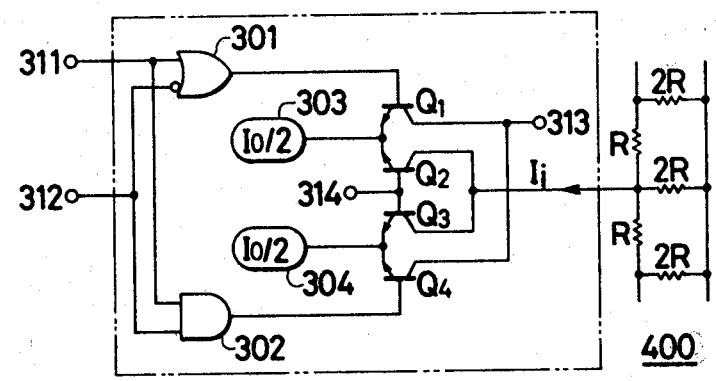
FIG. 3 is a diagram showing an example of circuit arrangement of essential portions of the circuit of FIG. 2.

FIG. 3 shows an example of the specific arrangement of the driver circuit 31. Referring to the figure, numeral 311 designates an input terminal to which the polarity bit signal S is applied; numeral 312 an input terminal to which the corresponding segment select bit signal $A_1$ is applied; numeral 301 a NOR circuit; numeral 302 an AND circuit; numerals 303 and 304 constant-current sources which absorb current ($I_o/2$). (A: Ampere); symbols $Q_1$, $Q_2$, $Q_3$ and $Q_4$ transistors; and numeral 313 a terminal for applying a supply voltage. In the present circuit, an output ($S + \overline{A_1}$) from the NOR circuit 301 and an output $S \cdot A_1$ from the AND circuit 302 are respectively applied to the bases of the transistors $Q_1$ and $Q_4$. The emitters of the transistors $Q_1$ and $Q_2$ are connected to the constant-current source 303. Likewise, the emitters of the transistors $Q_3$ and $Q_4$ are connected to the constant-current source 304. A threshold voltage $V_{th}$ is applied to the bases of the transistors $Q_2$ and $Q_3$ from a terminal 314. The value of this threshold voltage is set at the intermediate value between the voltage of a high level "1" and the voltage of a low level "0" of the logic signal ($S + \overline{A_1}$) or $S \cdot A_1$. Accordingly, if the logic signal ($S + \overline{A_1}$) is "1", the transistor $Q_2$ draws a current of O (A) from the ladder resistance network 400, and if the signal is "0", the transistor draw a current of ($I_o/2$) (A). Also the transistor $Q_3$ draws the current of 0 (A) or ($I_o/2$) (A), depending upon the logic signal $S \cdot A_1$. Accordingly, the current $I_1$ which is drawn from a node of the ladder network 400 becomes as indicated in Table 1 in dependence upon the polarity bit signal S and the segment select bit signal $A_1$. Such a circuit arrangement is shown, for example, in an article by J. L. Henry et al entitled "An Integrated PCM Encoder Using Interpolation", ISSCC 78, in the Digest of Technical Papers, on page 184.

TABLE 1

| S | $A_1$ | $S + \overline{A_1}$ | $S \cdot A_1$ | $I_1$ |
|---|---|---|---|---|
| 0 | 1 | 0 | 0 | $I_o$ |
| 0 | 0 | 1 | 0 | $\frac{I_o}{2}$ |
| 1 | 0 | 1 | 0 | $\frac{I_o}{2}$ |
| 1 | 1 | 1 | 1 | 0 |

The other driver circuits 32–38 can be constructed quite similarly.

Referring back to FIG. 2, letting $I_1$–$I_7$ denote the respective currents which the driver circuits 31–37 draw, $I_1$ has a weight double that of $I_2$ with respect to the output voltage of the output terminal 600. The same applies to $I_2$ relative to $I_3$, to $I_3$ relative to $I_4$, to $I_4$ relative to $I_5$, to $I_5$ relative to $I_6$, and to $I_6$ relative to $I_7$. In this manner, the ladder resistance network 400 can realize all the segments which are represented by the polarity bit signal S and the segment select bit signals $A_i$.

The linear PCM code is stored in the registers 201 and 202 every period $T_1$. The uniformly quantized bit signals of the less significant 4 bits are developed by the BRM 203 onto the time axis which is graduated by the period $T_2$ with the period $T_1$ equally divided by 16. The output B of the BRM 203 is applied to the driver circuit 38, the output of which is coupled with an output of the driver circuit 37 for the least significant bit of the segment select bit signals of the more significant 7 bits and then drives the least significant bit-node of the ladder resistance network 400. As a result, the weights of the currents $I_7$ and $I_8$ become equal with respect to the output voltage of the output terminal 600, and the weight of the least significant bit signal $A_7$ among the segment select bit signals becomes equal to the weight of the output B of the BRM 203.

Table 2 compares examples of input bits to driver circuits in the case of converting the linear PCM code of 12 bits into the analog signal, between the case of the prior-art arrangement in FIG. 1 and the case of this invention.

TABLE 2

(a) Prior Art

| bit (weight) | S | $A_0$ (128) | $A_1$ (64) | $A_2$ (32) | $A_3$ (16) | $A_4$ (8) | $A_5$ (4) | $A_6$ (2) | $A_7$ (1) | output voltage of ladder resistance network |
|---|---|---|---|---|---|---|---|---|---|---|
| B = 0 | 0 | 0 | 1 | 0 | 1 | 1 | 1 | 1 | 1 | +95 |
| B = 1 | 0 | 0 | 1 | 1 | 0 | 0 | 0 | 0 | 0 | +96 |

(b) This Invention

| bit (weight) | S | $A_1$ (64) | $A_2$ (32) | $A_3$ (16) | $A_4$ (8) | $A_5$ (4) | $A_6$ (2) | $A_7$ (1) | B (1) | output voltage of ladder resistance network |
|---|---|---|---|---|---|---|---|---|---|---|
| B = 0 | 0 | 1 | 0 | 1 | 1 | 1 | 1 | 1 | 0 | +95 |
| B = 1 | 0 | 1 | 0 | 1 | 1 | 1 | 1 | 1 | 1 | +96 |

In the case of the prior art indicated at (a) in Table 2, when the output B of the BRM 203 is "1", the result with "1" added by the digital adder must be made S and $A_0$–$A_7$. $A_o$ needs to be provided so as to prevent overflow in a case where $B=1$ occurs when all the bits $A_1$–$A_7$ are "1". In contrast, in the case of this invention indicated at (b) in Table 2, even when the output of the BRM 203 is "1", the bits S and $A_1$–$A_7$ may be the same as those when the output of the BRM 203 is "0". Merely by making B of the same weight as that of $A_7$ "1", the corresponding output voltage is obtained.

In a case where interpolative decoders for converting the linear PCM code of 12 bits into the analog signal are put into ICs according to the circuit arrangement of the prior art shown in FIG. 1 and the circuit arrangement of this invention thus far described, the prior-art construction requires about 1,000 gates, whereas the construction of this invention requires only about 600 gates because the digital adder and the register for storing the output thereof become unnecessary. Therefore, a reduction of as many as 400 gates can be achieved.

In accordance with this invention described above in detail, merely by additionally providing the driver circuit 38, any digital adder for adding the digital signal stored in the register 201 and the output B of the BRM 203 or any register for temporarily storing the output of the digital adder becomes unnecessary, and the simple D/A converter can be obtained.

We claim:

1. A digital-to-analog converter for decoding a linear PCM code comprising storage means having a plurality of input and output terminals for temporarily storing a multi-bit digital input signal in the form of a linear PCM signal including a first group of less-significant bits and a second group of more-significant bits, means connected to the output terminals of the storage means for receiving signals of said first group of bits of said digital input signal and for developing said signals into a train of 1-bit signals on a time axis, a ladder resistance network having respective segments corresponding to the bits of the second group of bits of said digital input signal, a group of driver circuits which are connected between the output terminals of said storage means and said ladder resistance network and which receive the signals of the second group of bits of said digital input signal and drive the corresponding segments of said ladder resistance network with these signals, and an additional driver circuit which is connected to the output of the developing means and which drives the segment of said ladder resistance network corresponding to the least significant bit of the second group of bits with the output signal of said developing means.

2. A digital-to-analog converter according to claim 1, wherein said developing means is a binary rate multiplier.

3. A digital-to-analog converter according to claim 1, wherein said ladder resistance network is an R-2R type ladder resistance network.

4. A digital-to-analog converter comprising storage means having a plurality of input and output terminals for temporarily storing a linear PCM signal of a plurality of bits including a group of less-significant bits, a group of more-significant bits, and a polarity bit signal of 1 bit, binary rate multiplier means connected to the output terminals of said storage means to receive signals of said group of less-significant bits of said linear PCM signal for developing said signals into a train of 1-bit signals on a time axis, a ladder resistance network which includes segments corresponding to signals of the group of more-significant bits of said linear PCM signal, a group of driver circuits which are connected between the output terminals of said storage means and said ladder resistance network and which drive the corresponding segments of said ladder resistance network in response to said polarity bit signal and the signals of the group of more-significant bits, and an additional driver circuit which receives the output signal of said binary rate multiplier and said polarity bit signal and which drives the segment of said ladder resistance network corresponding to the least significant bit of said group of more-significant bits.

5. A digital-to-analog converter according to claim 4, wherein the polarity bit signal is the most significant bit of the linear PCM signal.

* * * * *